United States Patent [19]
Pierson et al.

[11] Patent Number: 5,889,654
[45] Date of Patent: *Mar. 30, 1999

[54] ADVANCED CHIP PACKAGING STRUCTURE FOR MEMORY CARD APPLICATIONS

[75] Inventors: Mark V. Pierson, Binghamton; Kenneth L. Spink, Jr.; Thurston B. Youngs, Jr., both of Endicott, all of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 826,963

[22] Filed: Apr. 9, 1997

[51] Int. Cl.$^6$ ...................................................... H05K 7/20
[52] U.S. Cl. ........................ 361/720; 361/704; 361/707; 361/761; 361/719; 257/720
[58] Field of Search ..................................... 361/704, 707, 361/719, 720, 764, 761; 257/706, 707, 717, 718, 719, 787, 777, 778; 165/80.2, 80.3; 438/108, 109

[56] References Cited

U.S. PATENT DOCUMENTS

| | | | |
|---|---|---|---|
| 4,979,076 | 12/1990 | DiBugnara | 361/764 |
| 5,081,562 | 1/1992 | Adachi et al. | 361/764 |
| 5,083,237 | 1/1992 | Tsuji . | |
| 5,159,531 | 10/1992 | Horvath et al. . | |
| 5,270,902 | 12/1993 | Bellar et al. . | |
| 5,282,111 | 1/1994 | Hopfer . | |
| 5,287,247 | 2/1994 | Smits et al. | 361/761 |
| 5,323,294 | 6/1994 | Layton et al. | 361/704 |
| 5,373,420 | 12/1994 | Kao . | |
| 5,450,287 | 9/1995 | Ujiie . | |
| 5,450,288 | 9/1995 | Tanuma et al. | 361/761 |
| 5,452,183 | 9/1995 | Renn et al. . | |
| 5,489,749 | 2/1996 | DiStefano et al. . | |
| 5,532,512 | 7/1996 | Fillon et al. | 361/705 |
| 5,557,501 | 9/1996 | DiStefano et al. . | |
| 5,578,796 | 11/1996 | Bhatt et al. | 361/764 |
| 5,600,175 | 2/1997 | Orthmann | 257/532 |
| 5,608,262 | 3/1997 | Degani et al. | 257/777 |
| 5,628,031 | 5/1997 | Kikinis et al. | 361/749 |
| 5,689,600 | 11/1997 | Griffin | 385/88 |
| 5,724,232 | 3/1998 | Bhatt et al. | 361/764 |

FOREIGN PATENT DOCUMENTS 62-252948  4/1987  Japan .

OTHER PUBLICATIONS

E. Kunkler et al.; Module With Removable Heat Transfer Members; IBM Technical Disclosure Bulletin; vol. 23, No. 9, Feb. 1981; pp. 4095–4096.

S. Magdo; Semiconductor Encapsulation; IBM Technical Disclosure Bulletin; vol. 20, No. 10, Mar., 1978; pp. 3903–3905.

(List continued on next page.)

Primary Examiner—Leo P. Picard
Assistant Examiner—Boris L. Chervinsky
Attorney, Agent, or Firm—Whitham, Curtis & Whitham; Arthur J. Samodovitz, Esq.

[57] ABSTRACT

Integrated circuit chips (18, 42, or 56) are packaged within openings formed in a substrate such as PCMCIA Card (20, 40, or 54), thus allowing compliance with overall width dimension requirements for standardized electronic components. The arrangement has the advantages that thermal coefficient of expansion of the chips and cards match, and that a sturdy, multilayer ceramic substrate is used for electrical connection to electronic devices such as laptops, palmtops, and the like. In addition, a second integrated circuit chip (68) can be connected directly to the embedded chip (56), thereby allowing two chips to be accommodated in a card (54) at the same location and allowing chip-to-chip electrical communication. A variety of electrical bonding methods joining the embedded chip to the card can be employed. In addition, a variety of thermal conduction arrangements can be used for cooling the embedded integrated circuit chip.

22 Claims, 2 Drawing Sheets

OTHER PUBLICATIONS

TCM With Hollow Cylindrical Piston With Multiple Radial Fingers; IBM Technical Disclosure Bulletin; vol. 28, No. 3, Aug., 1985; p. 1215.

A. B.Cistola; Multilayer Ceramic Scanner Device Packaging; IBM Technical Disclosure Bulletin; vol. 19, No. 4, Sep. 1976; p. 1183.

J. Ameen; Thermally Enhanced High Performace Module; IBM Technical Disclosure Bulleting; vol. 31, No. 12; May 1989; pp. 410–411.

R.J. Betz; Monolithic Circuit Package; IBM Technical Disclosure Bulletin; vol. 10, No. 7, Dec., 1967; p. 877.

D.A. Bartlett et al.; Pinned Substrate For Circuit Chip Mounting; Research Disclosure, Jul. 1986, No. 267.

J. Gow, et al.; Selective Connection of Circuit Elements in Multilayer Ceramic Structure; Research Disclosure, Oct., 1989; No. 306.

ADVANCED CHIP PACKAGING STRUCTURE FOR MEMORY CARD APPLICATIONS

BACKGROUND OF THE INVENTION

1. Field of the Invention

The present invention generally relates to a chip packaging structure for memory cards and, more particularly, to a chip packaging structure wherein integrated circuit chips are embedded in openings formed in multilayer ceramic memory cards.

2. Background Description

The Personal Computer Memory Card International Association (PCMCIA) is a group of manufacturers and vendors which was formed to promote a common standard for PC Card-based peripherals and the slot designed to hold them. The standard card which was developed is approximately two inches by three inches in size, and is comprised of a multilayer laminate or ceramic material that is densely populated on its surface with surface mount (SMT) components. This standard card is referred to as a "PCMCIA Card". There are several different types of PCMCIA cards and include, for example, fax/modem interface, video adaptors, CD ROM adaptors, etc. These PCMCIA Cards are primarily used on laptop, palmtop, and other portable computers, as well as other intelligent electronic devices. The PCMCIA Card is housed in a stainless steel case, and fits within one of three currently standardized slots in the electronic device designed to receive PCMCIA Cards.

Thus, to comply with the PCMCIA standards a PCMCIA Card must meet exacting dimension specifications. However, supplier's of PCMCIA Cards design different cards to perform different functions depending on the electronic device in which they will be used. In addition to having different multilayer circuitry in the card itself, suppliers of these PCMCIA Cards populate the card with different SMT components. These components can be memories, central processing units (CPUs), etc. Currently, the components are mounted on the surfaces of the PCMCIA Cards using surface mount technology. Because the width of the PCMCIA Card must meet the PCMCIA standards for height, width, and thickness, there is considerable strain on the types of components which can be surface mounted to the PCMCIA Card (i.e., certain integrated circuit chips and surface mount strategies may make the overall dimensions of the Memory Card too thick to satisfy the PCMCIA standard).

SUMMARY OF THE INVENTION

It is an object of this invention to provide an advanced chip packaging structure that has particular utility in PCMCIA applications.

It is another object of this invention to provide a chip packaging structure which embeds integrated circuit chips within openings in substrates such as Memory Cards such that overall width requirements, such as the PCMCIA standards can be easily satisfied.

It is yet another object of this invention to provide a chip packaging structure for PCMCIA applications that accommodates a wide variety of heat sink configurations.

It is still another object of this invention to provide a chip packaging structure for PCMCIA applications that accommodates chip-to-chip interconnectivity.

According to the invention, openings are selectively made or formed in a substrate, such as a multilayer ceramic substrate used in a PCMCIA card, to accommodate integrated circuit chips therein. A chip is positioned within the opening and electronically connected to circuitry on the substrate. Since the chip is embedded within the substrate, it does not increase the overall thickness of the substrate had the chip been bonded to the surface of the substrate. In this way, the exacting dimension specifications of PCMCIA cards can be more easily satisfied. The integrated circuit chip can be electrically connected to the circuitry on the substrate by a wide variety of techniques including wire bonding, using electrically conductive adhesive, or using pull off flex and break-apart circuit lines. In addition, if required, a variety of different heat sink configurations can be used for the embedded integrated circuit chips. Furthermore, by embedding an integrated circuit chip within the substrate, a second integrated circuit chip could be bonded to the surface of the embedded chip as if it were the surface of the substrate, thus allowing chip-to-chip electrical communication. Chip-to-chip configurations may be useful, for example, in applications where the embedded chip is a CPU, and the surface bonded chip is a memory device.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1:
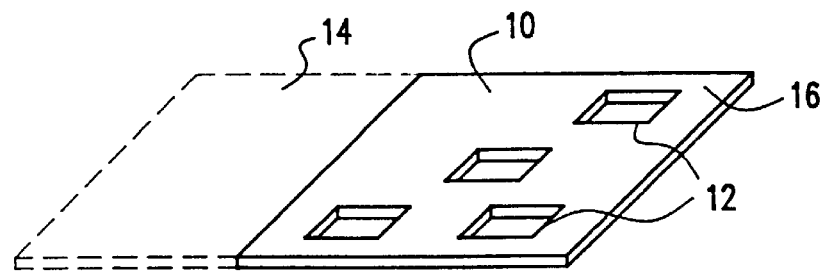
FIG. 1 is an isometric view of a substrate with openings created therein for accommodating integrated circuit chips.

FIG. 1 shows a substrate 10 with a plurality of openings 12 formed therein. The width of the substrate 10 can vary as shown by dashed section 14 depending on how many images are to be processed at one time. The substrate 10 preferably has an electronic connection region 16 on one edge. In the preferred embodiment, the substrate 10 will be a multilayer, electronic-ceramic device such as those used in PCMCIA Memory Cards. The openings 12 can be created by a number of means including pre-forming in "green" condition, stamping, etching, laser ablating, etc., and are sized to accommodate integrated circuit chips that are desired for use in the PCMCIA Card. The position of the openings 12 will vary and depend on the function and design of the Memory Card.

Figure 2:
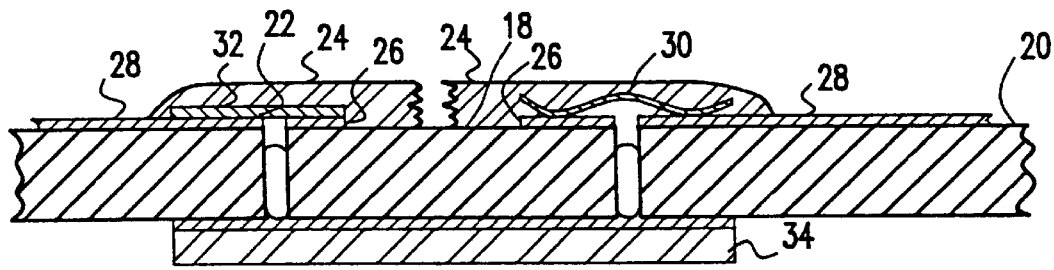
FIG. 2 is a cross-sectional side view of an integrated circuit chip embedded within an opening in a substrate wherein the chip fits within an opening that extends through the width of the substrate.

FIG. 2 shows an integrated circuit chip 18 positioned within an opening in a PCMCIA Card 20, or other substrate or carrier. The circuitry in the chip 18 can be connected to the circuitry in the PCMCIA Card by a variety of techniques. The left side of FIG. 2 shows an electrically conductive adhesive 22 covered by an encapsulating material 24 used to join electrical connection sites 26 and 28 on the chip 18 and PCMCIA Card 20, respectively. The right side of FIG. 2 shows a wire bond 30 positioned within encapsulating material 24 that bridges electrical connection sites 26 and 28. The integrated circuit chip 18 can be joined to the PCMCIA Card 20 using a joining material 32 such as an adhesive or solder. A thin metallic heat sink 34 can be connected to the back side of the integrated circuit chip 18 using the same or a different joining material 32. In PCMCIA applications, it is preferable that the heat sink 34 be thin so as to not increase the overall thickness of the PCMCIA Card.

Because the integrated circuit chip 18 is embedded within the opening of the PCMCIA Card 20, it does not increase the overall thickness dimension. Hence, compliance with PCMCIA standards is more easily achieved. Furthermore, the packaging design shown in FIGS. 2–6, has the advantages that a multilayer ceramic substrate 20 is used instead of a thinner card that puts mechanical demands on flexible components or a card that is very rigid, and that there is thermal expansion compatibility between integrated circuit chips and the ceramic used to produce the multilayer ceramic PCMCIA Card.

Figure 3:
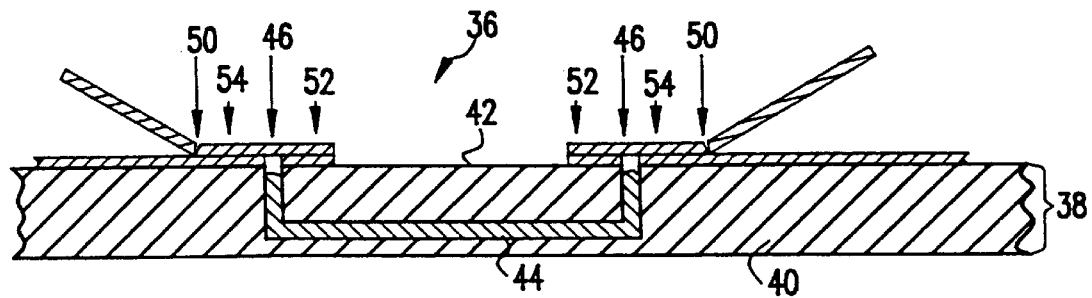
FIG. 3 is a cross-sectional side view of an integrated circuit chip embedded within an opening in a substrate wherein the chip fits within an opening that does not extend through the width of the substrate.

FIG. 3 shows an embodiment of the invention where the opening 36 does not extend completely through the thickness dimension 38 of the PCMCIA Card 40, or other substrate or carrier. In this application, the integrated circuit chip 42 could be joined to the PCMCIA Card 40 by a joining material 44 such as an adhesive or solder positioned in the base and on the sides of the opening 36. FIG. 3 also shows thermal compression bonding at regions 46 and break apart 50 circuit lines used to join electrical connection sites 52 and 54 on the integrated circuit chip 42 and PCMCIA Card 40, respectively. The chip packaging structure shown in FIG. 3 allows additional integrated circuit chips (not shown) to be bonded to the back side of the PCMCIA Card 40 in the same region as the embedded chip 42.

Figure 4:
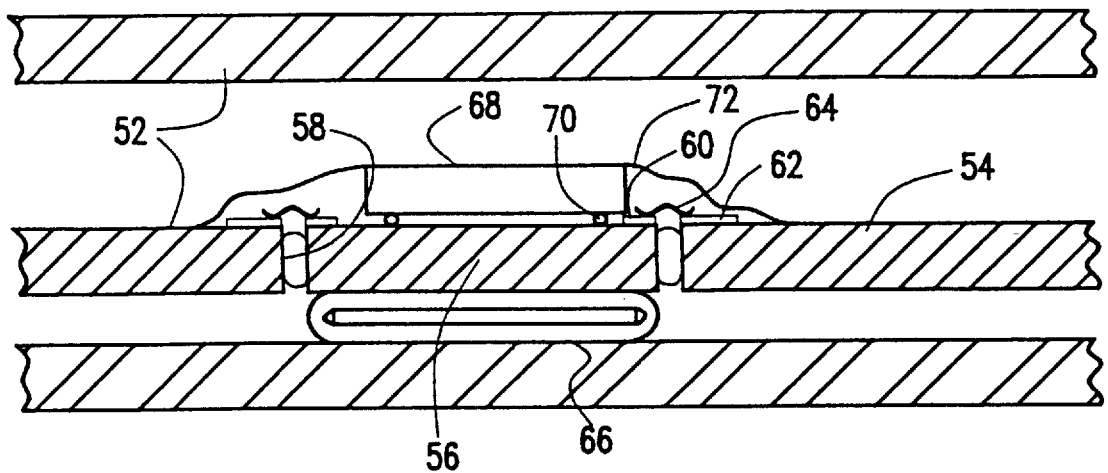
FIG. 4 is a schematic cross-sectional side view of an integrated circuit chip embedded within a substrate with a second integrated circuit chip connected to the embedded chip.

FIG. 4 shows a packaging structure that has particular application to PCMCIA Cards and shows the outer stainless steel casement 52 positioned on either side of the card 54. An integrated circuit chip 56 is positioned within an opening in the card 54 and can be preferably joined thereto using a joining material 58 such as an adhesive or solder. Electrical connection sites 60 and 62 on the chip 56 and card 54 are wire bonded 64 together to establish electrical communication there between. A flexible metal member 66 is positioned to allow thermal conductivity between the integrated circuit chip 56 and metal casement 52.

Also shown in FIG. 4 is a second integrated circuit chip 68 that is bonded to the surface of the embedded integrated circuit chip 56 using flip-chip or other bonding media 70. Thus, the design of FIG. 4 allows two chips to be used in the card at the same location without increasing the overall thickness dimension beyond what would be achieved if the chips were simply surface bonded to the card. Furthermore, the two chips 56 and 68 are electrically connected, thereby allowing chip-to-chip communication and data transfer. The arrangement shown in FIG. 4 might be useful in the situation where a CPU is used as chip 56 and a memory device is used as chip 68, but could also be useful in other applications. An encapsulating material 72 covers both the chip 68 and the wire bond 64, thus holding them to the card 54.

Figure 5:
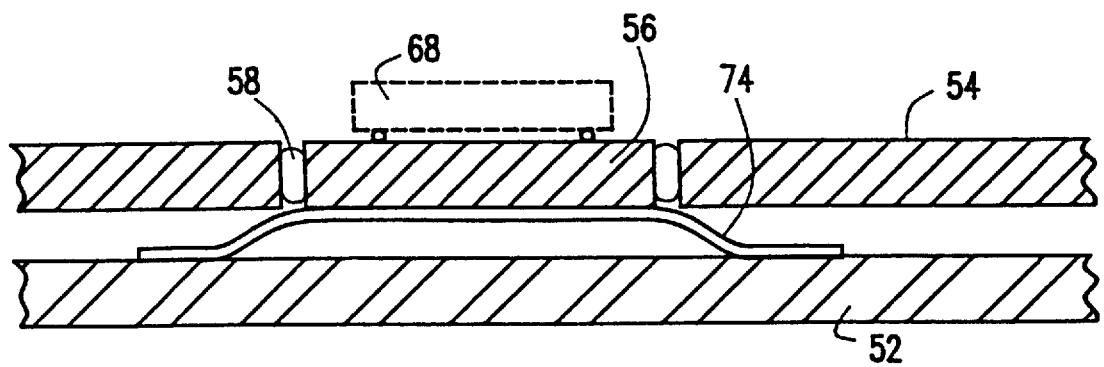
FIG. 5 is a schematic cross-sectional side view of an integrated circuit chip embedded within a substrate with a second integrated circuit chip connected to the embedded chip similar to that shown in FIG. 4, but illustrating an alternative heat sink arrangement.

FIG. 5 shows a variation on the packaging strategy shown in FIG. 4 and includes a flexed metallic member 74 positioned adjacent integrated circuit chip 56 for dissipating heat from both chip 56 and chip 68 to the steel casement 82.

Figure 6:
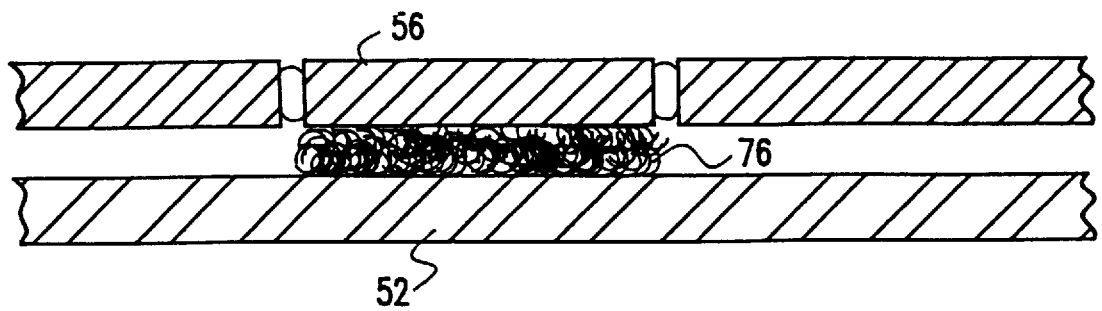
FIG. 6 is a schematic cross-sectional side view of an integrated circuit chip embedded within a substrate showing yet another alternative heat sink arrangement.

FIG. 6 shows a variation where steel wool 76 or any other fibrous member is used to dissipate heat from the chip 56 to the casement 82.

While the invention has been described in terms of its preferred embodiments, those of skill in the art will recognize that the invention can be practiced with modification within the spirit and scope of the appended claims.

We claim:

1. A chip packaging structure, comprising:

a substrate having a first planar surface and a second planar surface, said substrate further having a thickness and at least one opening extending from the first planar surface to the second planar surface of said substrate in said thickness dimension;

a first electrical connection site positioned on said substrate chip;

an integrated circuit chip having a first planar surface and a second planar surface and positioned within said opening in said substrate, said integrated circuit chip first planar surface being coplanar with said substrate first planar surface and said integrated circuit chip second planar surface being coplanar with said substrate second planar surface thereby forming first and second flush mounting surfaces, respectively;

a second electrical connection site positioned on said integrated circuit chip; and an electrical connection extending between said first and second electrical connection sites, said electrical connection forming a second planar surface above and parallel to said first flush mounting surface.

2. The chip packaging structure of claim 1, wherein said substrate is a ceramic material.

3. The chip packaging structure of claim 1, wherein said substrate is part of a PCMCIA Card.

4. The chip packaging structure of claim 1, wherein said opening in said substrate extends completely through said thickness dimension.

5. The chip packaging structure of claim 1, wherein said opening in said substrate extends to a selected level within said thickness dimension of said substrate.

6. The chip packaging structure of claim 1, further comprising a joining material positioned between said integrated circuit chip and said substrate within said opening in said substrate for securing said integrated circuit chip to said substrate.

7. The chip packaging structure of claim 1, further comprising an encapsulating material positioned over said integrated circuit chip.

8. The chip packaging structure of claim 1, wherein said electrical connection is a wire bond.

9. The chip packaging structure of claim 1, wherein said electrical connection is a conductive adhesive.

10. The chip packaging structure of claim 1, wherein said electrical connection is a break apart circuit line.

11. The chip packaging structure of claim 1, further comprising a thermal conducting element positioned in contact with said integrated circuit chip.

12. The chip packaging structure of claim 11, wherein said thermal conducting element is spring biased.

13. The chip packaging structure of claim 11, wherein said thermal conducting element is a fibrous material consisting essentially of steel wool heat transfer material.

14. The chip packaging structure of claim 1, further comprising a second integrated circuit chip connected to said integrated circuit chip.

15. The chip packaging structure of claim 14, wherein:
said second electrical circuit chip is positioned above said opening in said substrate, and
an active area of said second electrical circuit chip faces an active area of said integrated circuit chip.

16. The chip packaging structure of claim 1, further comprising a housing encasing said substrate.

17. The chip packaging structure of claim 1, wherein said first electrical connection site and said second electrical connection site form a planar surface between said substrate planar surface and said second planar surface.

18. The chip packaging structure of claim 14, wherein said second integrated circuit chip is substantially connected to and directly above said integrated circuit chip.

19. The chip packaging structure of claim 1, wherein:
said integrated circuit chip has a diameter slightly smaller than a diameter of said opening thereby creating a space between said integrated circuit chip and said substrate, and
a joining material fitted within said space to join said integrated circuit chip to said substrate.

20. A chip packaging structure, comprising:
a substrate having a thickness and a planar surface in said thickness dimension, said substrate further having a cavity extending partially through said thickness of said substrate;
a first electrical connection site being positioned on a side of said cavity;
an integrated circuit chip being positioned within said cavity in said substrate and having a coplanar surface with said substrate planar surface, said integrated circuit chip having a diameter slightly smaller than a diameter of said cavity thereby creating a space between said integrated circuit chip and the substrate;
a second electrical connection site being positioned on said integrated circuit chip; and
an electrical connection extending between said first and second electrical connection sites and forms a planar surface above and parallel to the substrate planar surface and the integrated circuit coplanar surface.

21. The chip packaging structure of claim 20, wherein:
said electrical connection extending between said first electrical connection site and said second electrical connection site forms a second planar surface above and substantially parallel to said substrate planar surface, and
said first electrical connection site and said second electrical connection site form a planar surface between said substrate planar surface and said second planar surface.

22. The chip packaging structure of claim 20, further comprising a joining material fitted within said space to join said integrated circuit chip to said substrate.

* * * * *